United States Patent
Yamamoto

(10) Patent No.: US 10,896,272 B2
(45) Date of Patent: Jan. 19, 2021

(54) HIGH-LEVEL SYNTHESIS DEVICE, HIGH-LEVEL SYNTHESIS METHOD, AND COMPUTER READABLE MEDIUM

(71) Applicant: Mitsubishi Electric Corporation, Tokyo (JP)

(72) Inventor: Ryo Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/470,068

(22) PCT Filed: Feb. 7, 2017

(86) PCT No.: PCT/JP2017/004441
§ 371 (c)(1),
(2) Date: Jun. 14, 2019

(87) PCT Pub. No.: WO2018/146727
PCT Pub. Date: Aug. 16, 2018

(65) Prior Publication Data
US 2020/0242291 A1    Jul. 30, 2020

(51) Int. Cl.
*G06F 30/327*    (2020.01)

(52) U.S. Cl.
CPC ................ *G06F 30/327* (2020.01)

(58) Field of Classification Search
USPC ........................................ 716/104
See application file for complete search history.

(56) References Cited

U.S. PATENT DOCUMENTS

| 2005/0268271 A1* | 12/2005 | Gutberlet ............... G06F 8/443 716/102 |
| 2005/0273752 A1 | 12/2005 | Gutberlet et al. |
| 2008/0148215 A1 | 6/2008 | Gutberlet et al. |
| 2009/0031276 A1 | 1/2009 | Seno |

(Continued)

FOREIGN PATENT DOCUMENTS

| JP | 2008-501185 A | 1/2008 |
| JP | 2009-32086 A | 2/2009 |

(Continued)

OTHER PUBLICATIONS

International Search Report (PCT/ISA/210) issued in PCT/JP2017/004441, dated Apr. 11, 2017.

*Primary Examiner* — Bryce M Aisaka
(74) *Attorney, Agent, or Firm* — Birch, Stewart, Kolasch & Birch, LLP

(57) ABSTRACT

A high-level synthesis device executes high-level synthesis on a behavioral description including a plurality of loop descriptions and a logical description. An extraction unit extracts loop descriptions that can be merged with the logical description without changing a function, as loop description candidates, from the plurality of loop descriptions. The extraction unit also calculates characteristics of a circuit of a case where the logical description is merged with each of the loop description candidates, as circuit characteristics. A determination unit determines a loop description to be merged with the logical description, from the loop description candidates based on the circuit characteristics. A merge unit merges the logical description with the loop description determined by the determination unit.

16 Claims, 13 Drawing Sheets

(56) References Cited

U.S. PATENT DOCUMENTS

2012/0272198 A1\* 10/2012 Baumgartner ........ G06F 30/327
716/107
2016/0275213 A1  9/2016 Tomita

FOREIGN PATENT DOCUMENTS

| JP | 2010-237858 A | 10/2010 |
| JP | 2011-215966 A | 10/2011 |
| JP | 2013-235474 A | 11/2013 |
| JP | 2016-177454 A | 10/2016 |

\* cited by examiner

Fig. 2

151 : BEHAVIORAL DESCRIPTION

```
int x[100];
short a,c;
int b;
....
LOOP_A:
  for(i=0;i<N;i++){
    x[i] = ...;
    b=;
  }
EXE_B1:
  c = b...;//Formula1
EXE_B2:
  a = c....;//Formula2
LOOP_C:
  for(i=0;i<N;i++){
    ... = a;
    y[i] = x[i] ...;
  }
```

511 : LOOP DESCRIPTION

512 : LOGICAL DESCRIPTION

512

511

154 : CIRCUIT CHARACTERISTICS INFORMATION

| MERGE DFG | FROM NODE | TO NODE | TOTAL NUMBER OF BITS |
|---|---|---|---|
| MERGE DFGA | LOOP_A/EXE_B1/EXE_B2 | LOOP_C | 3216 |
| MERGE DFGB | LOOP_A | EXE_B1/EXE_B2/LOOP_C | 3232 |

Fig. 11

157, 157a : CONVERTED BEHAVIORAL DESCRIPTION

```
int x[100];
short a,c;
int b;
....
LOOP_A:
  for(i=0;i<N;i++){
    x[i] = ...;
    b=;
    if( i == N-1){
      c = b...;//Formula1
      a = c....;//Formula2
    }
  }
LOOP_C:
  for(i=0;i<N;i++){
    ... = a;
    y[i] = x[i] ...;
  }
```

MERGE LOGICAL DESCRIPTION 512 WITH FORMER LOOP DESCRIPTION 531

Fig. 13

157, 157b : CONVERTED BEHAVIORAL DESCRIPTION

```
int x[100];
short a,c;
int b;
....
LOOP_A:
 for(i=0;i<N;i++){
   x[i] = ...;
   b=;
 }
LOOP_C:
 for(i=0;i<N;i++){
   if( i == 0){
     c = b...;//Formula1
     a = c....;//Formula2
   }
   ... = a;
   y[i] = x[i] ...;
 }
```

MERGE LOGICAL DESCRIPTION 512 WITH LATTER LOOP DESCRIPTION 532

HIGH-LEVEL SYNTHESIS DEVICE, HIGH-LEVEL SYNTHESIS METHOD, AND COMPUTER READABLE MEDIUM

TECHNICAL FIELD

The present invention relates to a high-level synthesis device for automatically generating a register transfer level (RTL) description from a behavioral description. Particularly, the present invention relates to a high-level synthesis device, a high-level synthesis method, and a high-level synthesis program which support semiconductor design using behavioral synthesis.

BACKGROUND ART

In the conventional semiconductor integrated circuit design, design was conducted by RTL that describes, in a hardware description language, the behavior of a combinational circuit between registers (flip-flops) included in a circuit. In recent years, the circuit scale of the integrated circuit has increased and a long RTL design time is required, posing an issue. In view of this, a technique has been proposed which performs design using a high-level language such as C language, C++ language, System C language, and MATLAB language with higher abstraction level than RTL, thereby automatically generating RTL. A tool that realizes this technique is commercially available as a high-level synthesis tool.

As for circuit specifications which cannot be expressed in high-level languages or which cannot be expressed efficiently by a source code, the designer sets options, attributes, or high-level synthesis options such as pragmas, and inputs them to a high-level synthesis tool, thereby performing circuit design.

However, with the current high-level synthesis tool, regarding the array description in a for-loop description, the designer performs design of determining the type and number of memories, and changes the source code so that a designed configuration can be achieved. The designer further needs to set appropriate options, attributes, or pragmas. These designing operations require knowledge of hardware. A designer without the knowledge of hardware is not capable of designing mentioned above, and accordingly not capable of creating a circuit having an appropriate circuit scale and performance.

Patent Literature 1 discloses a method of automatically determining a memory configuration by paying attention to array access in a loop description. Also, Patent Literature 2, by paying attention to the hierarchical structure of the C language, discloses separating a source code into an arithmetic element and a control element, and converting the control element by a data transfer unit converter, thereby separating the control element that requires the knowledge of hardware. In high-level synthesis, a concept of module exists, as indicated by these Patent Literatures. High-level synthesis is performed in units of modules. A designer will divide modules appropriately and design data transfer between the modules.

In a case of simple data transfer in which one ordinary memory is inserted between modules, the designer only needs to set options by using a high-level synthesis tool. In practice, however, special data transfer is performed for the purpose of increasing the data transfer efficiency, shortening the latency, and suppressing the circuit scale.

In this manner, when high-level synthesis is used, in general, the designer defines the module and performs design on a buffer and control between modules.

CITATION LIST

Patent Literature

Patent Literature 1: JP 2013-235474 A
Patent Literature 2: JP 2011-215966 A

SUMMARY OF INVENTION

Technical Problem

However, the definition of the module differs depending on the designer. It is difficult to judge where to divide the modules in a source code. In general, high-level synthesis is premised on hardware acceleration and accordingly includes many loop descriptions. Therefore, defining a loop description as one module is easy to understand and can be practiced with simple judgment criteria. In reality, however, in many cases, a logic that is not a loop exists between a plurality of loop descriptions. If a logic exists between a plurality of loop descriptions, it is necessary to decide whether to define this logic as one module, or to put this logic together with the loop descriptions and define the gathered result as one loop.

Patent Literature 1 pays attention only to access between loops. No determination is made as to a case where another logic that is not a loop exists between loops, whether to merge this another logic as a module.

In Patent Literature 2, by paying attention to the hierarchical structure of the C language, separation into an arithmetic operation part and a control part is performed. However, if a description such as an if-sentence other than a simple loop is treated as one unit, the number of blocks increases. Then, delay increases and the labor of the designer increases.

In this manner, when a logic exists between a plurality of loops, definition of the module of the logic poses an issue.

It is an objective of the present invention to provide a high-level synthesis device capable of merging a logic that is not a loop and that exists before or after a loop description in a source code, with a former loop existing above the source code of the logic or with a latter loop existing under the source code of the logic.

Solution to Problem

A high-level synthesis device according to the present invention executes high-level synthesis on a behavioral description describing a behavior of a circuit that implements a function, the behavioral description including a plurality of loop descriptions describing a repetitive process and a logical description describing a process that is not a repetitive process.

The high-level synthesis device includes:

an extraction unit to extract loop descriptions that can be merged with the logical description without changing the function, as loop description candidates, from among the plurality of loop descriptions, and calculate, as circuit characteristics, characteristics of the circuit of a case where the logical description is merged with each of the loop description candidates;

a determination unit to determine a loop description to be merged with the logical description, from the loop description candidates based on the circuit characteristics; and a merge unit to merge the logical description with the loop description determined by the determination unit.

Advantageous Effects of Invention

A high-level synthesis device according to the present invention executes high-level synthesis on a behavioral description including a plurality of loop descriptions describing a repetitive process and a logical description describing a process that is not a repetitive process. An extraction unit extracts a loop description that can be merged with the logical description without changing a function, as a loop description candidate, from the plurality of loop descriptions. The extraction unit also calculates, as circuit characteristics, characteristics of a circuit of a case where the logical description is merged with each loop description candidate. A determination unit determines a loop description to be merged with the logical description, from the loop description candidate based on the circuit characteristics. A merge unit merges the logical description with the loop description determined by the determination unit. Therefore, with the high-level synthesis device according to the present invention, source code module division can be practiced automatically and appropriately, so that optimum circuit design can be performed within a short period of time.

BRIEF DESCRIPTION OF DRAWINGS

FIG. 2 illustrates a sample code of a behavioral description 151 according to Embodiment 1.

FIG. 11 illustrates an example of a converted behavioral description 157a of when former merge process S131 according to Embodiment 1 is practiced.

FIG. 13 illustrates an example of a converted behavioral description 157b of when latter merge process S132 according to Embodiment 1 is practiced.

DESCRIPTION OF EMBODIMENTS

Figure 1:
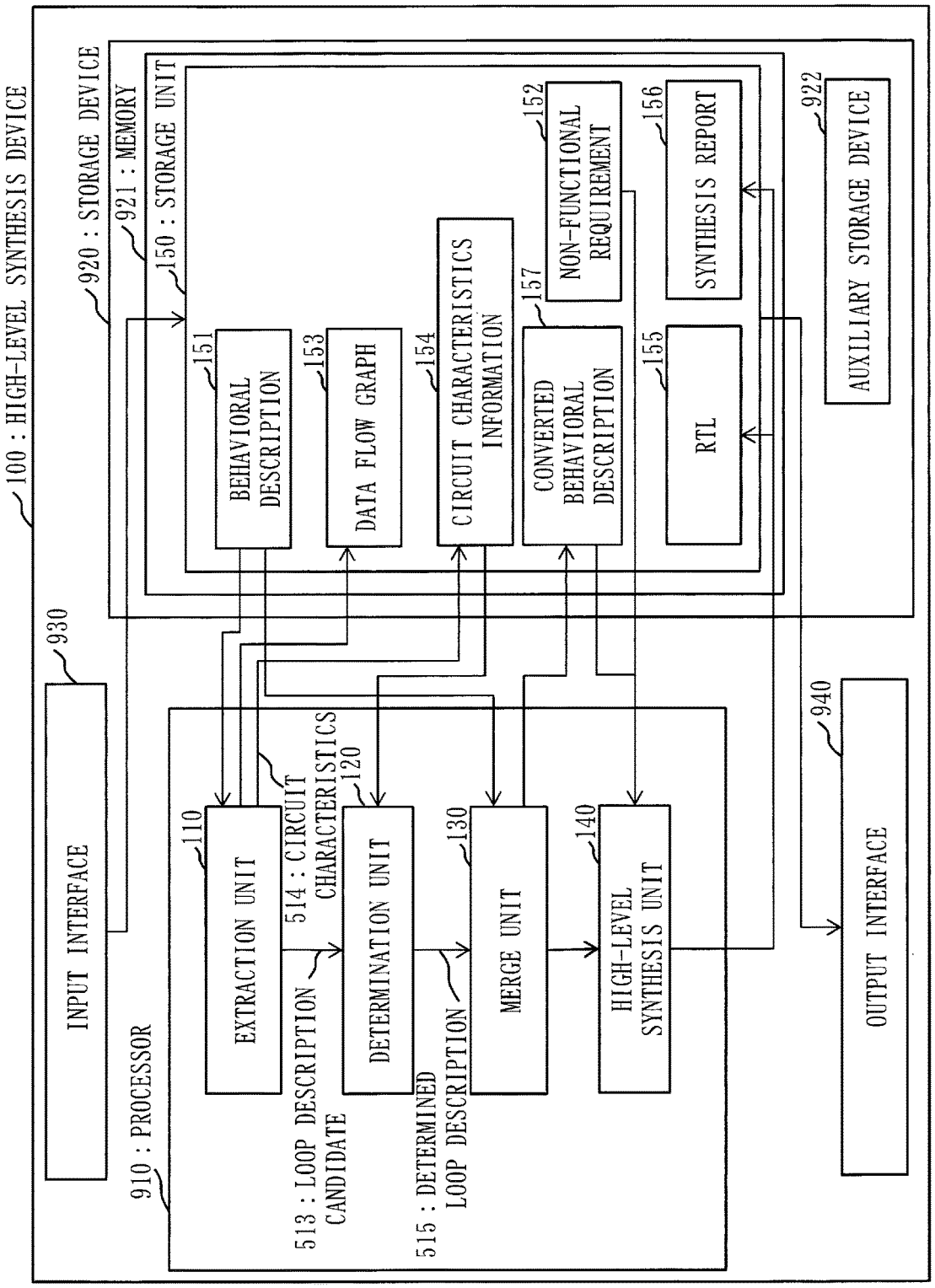
FIG. 1 is a configuration diagram of a high-level synthesis device 100 according to Embodiment 1.

An embodiment of the present invention will now be described with reference to drawings. The same or equivalent portions in the drawings are denoted by the same reference numeral. In the description of embodiment, explanation of the same or equivalent portions will be appropriately omitted or simplified.

Embodiment 1

*Description of Configuration*

A configuration of a high-level synthesis device 100 according to this embodiment will be described with reference to FIG. 1.

As illustrated in FIG. 1, the high-level synthesis device 100 is a computer.

The high-level synthesis device 100 is provided with hardware devices such as a processor 910, a storage device 920, an input interface 930, and an output interface 940. The storage device 920 includes a memory 921 and an auxiliary storage device 922.

The high-level synthesis device 100 is provided with an extraction unit 110, a determination unit 120, a merge unit 130, a high-level synthesis unit 140, and storage unit 150, as functional configuration. A behavioral description 151, a non-functional requirement 152, a data flow graph 153, circuit characteristics information 154, an RTL 155, a synthesis report 156, and a converted behavioral description 157 are stored in the storage unit 150.

The functions of the extraction unit 110, determination unit 120, merge unit 130, and high-level synthesis unit 140 are implemented by software.

The storage unit 150 is implemented by the memory 921. Alternatively, the storage unit 150 may be implemented by the auxiliary storage device 922 alone, or by the memory 921 and auxiliary storage device 922. How to implement the storage unit 150 is arbitrary.

The processor 910 is connected to the other hardware devices via signal lines and controls these other hardware devices. The processor 910 is an integrated circuit (IC) which performs arithmetic processing. Specific examples of the processor 910 are a central processing unit (CPU), a digital signal processor (DSP), and a graphics processing unit (GPU).

The memory 921 is a storage unit that stores data temporarily. Specific examples of the memory 921 are a static random access memory (SRAM) and a dynamic random access memory (DRAM).

The auxiliary storage device 922 is a storage device that keeps data. A specific example of the auxiliary storage device 922 is a hard disk drive (HDD). Alternatively, the auxiliary storage device 922 may be a portable storage medium such as a secure digital (SD; registered trademark) memory card, a compact flash (CF), a NAND flash, a flexible disk, an optical disk, a compact disk, a blu-ray (registered trademark) disk, and a digital versatile disk (DVD).

The input interface 930 is a port to be connected to an input device such as a mouse, a keyboard, and a touch panel. The input interface 930 is more specifically a universal serial bus (USB) terminal. Alternatively, the input interface 930 may be a port to be connected to a local area network (LAN).

The output interface 940 is a port to which a cable of a display device such as a display is connected. The output interface 940 is more specifically a USB terminal or a high definition multimedia interface (HDMI; registered trademark) terminal. The display is more specifically a liquid crystal display (LCD).

A program that implements the functions of the extraction unit 110, determination unit 120, merge unit 130, and high-level synthesis unit 140 is stored in the auxiliary storage device 922. The program that implements the functions of the extraction unit 110, determination unit 120, merge unit 130, and high-level synthesis unit 140 is also called a high-level synthesis program 620. This program is loaded to the memory 921, read by the processor 910, and executed by the processor 910. An OS is stored in the auxiliary storage device 922. The OS in the auxiliary storage device 922 is loaded to the memory 921 at least partly. The processor 910 executes the high-level synthesis program 620 while executing the OS.

The high-level synthesis device 100 may be provided with only one processor 910, or a plurality of processors 910. The plurality of processors 910 may cooperate to execute the program that implements the functions of the extraction unit 110, determination unit 120, merge unit 130, and high-level synthesis unit 140.

Information, data, signal values, and variable values indicating the processing results of the extraction unit 110, determination unit 120, merge unit 130, and high-level synthesis unit 140 are stored in the auxiliary storage device 922 or memory 921 of the high-level synthesis device 100, or in a register or cache memory in the processor 910 of the high-level synthesis device 100.

The program that implements the functions of the extraction unit 110, determination unit 120, merge unit 130, and high-level synthesis unit 140 may alternatively be stored in a portable recording medium. A portable recording medium is more specifically a magnetic disk, a flexible disk, an optical disk, a compact disk, a blu-ray (registered trademark) disk, or a digital versatile disc (DVD).

A high-level synthesis program product signifies a storage medium and storage device in which the high-level synthesis program 620 is stored. The high-level synthesis program product refers to any product loaded with a computer readable program, whatever appearance the product may have.

The behavioral description 151 according to this embodiment will be described with reference to FIG. 2.

The behavioral description 151 is a source code describing the behavior of a circuit that implements the functions. The behavioral description 151 is described using a high-level language such as C language, C++ language, System C language, and MATLAB language. The behavioral description 151 includes a plurality of loop descriptions 511 describing a repetitive process and a logical description 512 describing a process that is not a repetitive process. As illustrated in FIG. 2, the behavioral description 151 includes a plurality of logical descriptions 512. If only one logical description 512 is included in the behavioral description 151, this embodiment is still applicable.

FIG. 2 is a diagram illustrating a sample code of the behavioral description 151. This sample code is a sample having two loop descriptions 511 and two logical descriptions 512 in between. Labels are attached to the sample code for the sake of simple description. These labels can be omitted. A logic not necessary in describing this embodiment has been removed from this sample code, and accordingly this sample code is incomplete as C language.

The non-functional requirement 152 is a file that defines a non-functional requirement such as the required circuit latency and memory usage.

The non-functional requirement 152 and the converted behavioral description 157 which is converted from the behavioral description 151 are inputted to the high-level synthesis unit 140. The function of the circuit expressed by the converted behavioral description 157 is identical with the function of the circuit expressed by the behavioral description 151. The high-level synthesis unit 140 performs high-level synthesis based on the behavioral description 151 and the non-functional requirement 152 and outputs the RTL 155 and the synthesis report 156 being the non-functional requirement of the RTL 155. The synthesis report 156 includes the same items as those of the non-functional requirement 152.

The data flow graph 153 is a graph illustrating the relation among modules being run units described in the behavioral description 151. The data flow graph is sometimes abbreviated as DFG.

*Description of Behavior*

Figure 3:
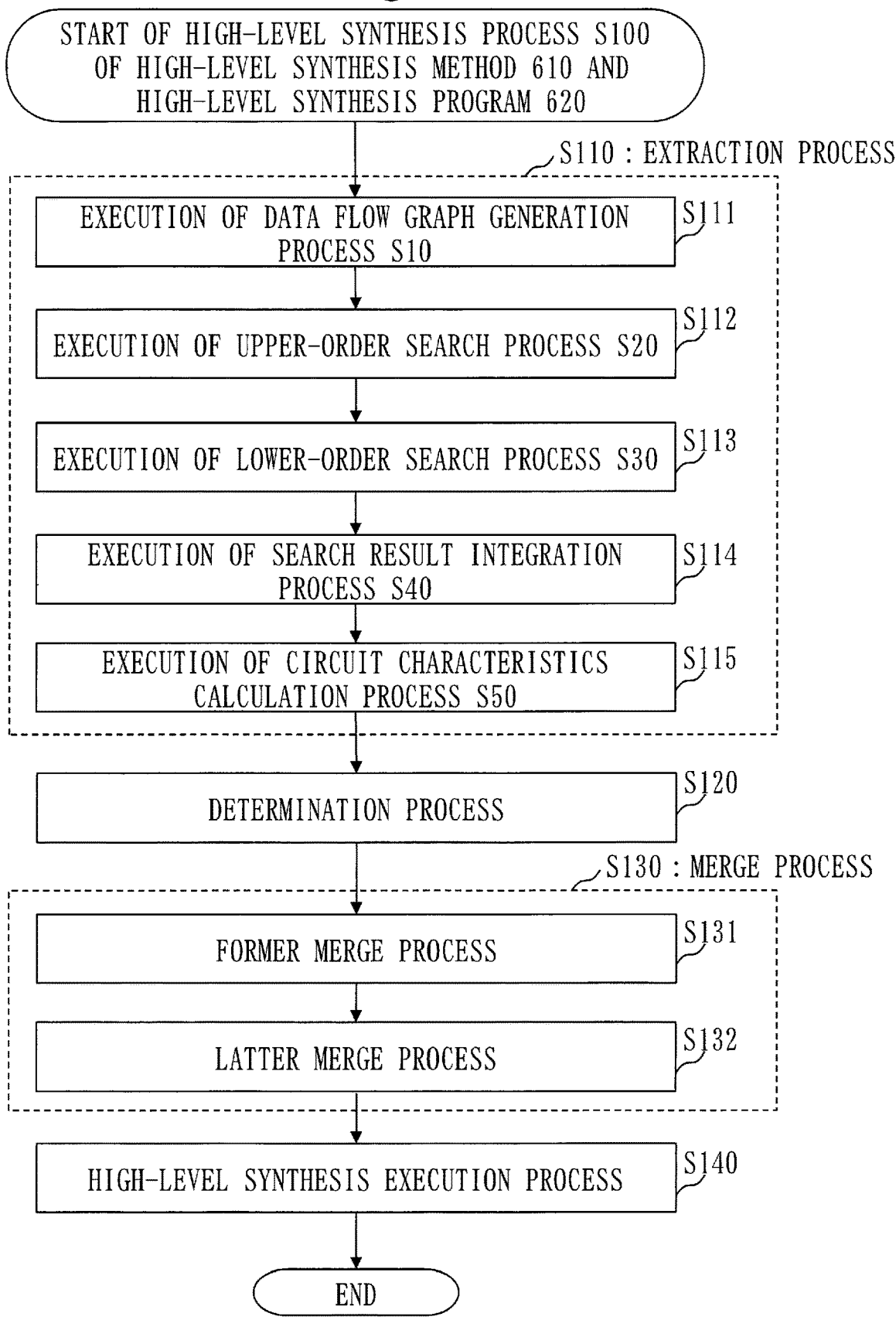
FIG. 3 is a flowchart illustrating high-level synthesis process S100 of a high-level synthesis method 610 and high-level synthesis program 620 according to Embodiment 1.

High-level synthesis process S100 of a high-level synthesis method 610 and the high-level synthesis program 620 each according to this embodiment will be described with reference to FIG. 3.

High-level synthesis process S100 has extraction process S110, determination process S120, merge process S130, and high-level synthesis execution process S140. Extraction process S110 has data flow graph generation process S10, upper-order search process S20, lower-order search process S30, search result integration process S40, and circuit characteristics calculation process S50. Merge process S130 has former merge process S131 and latter merge process S132.

<Extraction Process S110>

In extraction process S110, the extraction unit 110 extracts loop descriptions 511 that can be merged with a logical description 512 without changing a function, as loop description candidates 513, from among the plurality of loop descriptions 511. More specifically, the extraction unit 110 analyzes the loop descriptions 511, and the logical descriptions 512 which exist before and after the loop description 511 and which are not repetitive processes, to learn which loop description 511 the logical description 512 can be merged with. Then, the extraction unit 110 calculates, as circuit characteristics 514, the characteristics of the circuit of a case where the logical description 512 is merged with each of the loop description candidates 513.

<Data Flow Graph Generation Process S10>

In step S111, the extraction unit 110 executes data flow graph generation process S10. The extraction unit 110 generates a data flow graph having the plurality of loop descriptions 511 and the logical description 512, which are included each as a node in the behavioral description 151.

Figure 4:
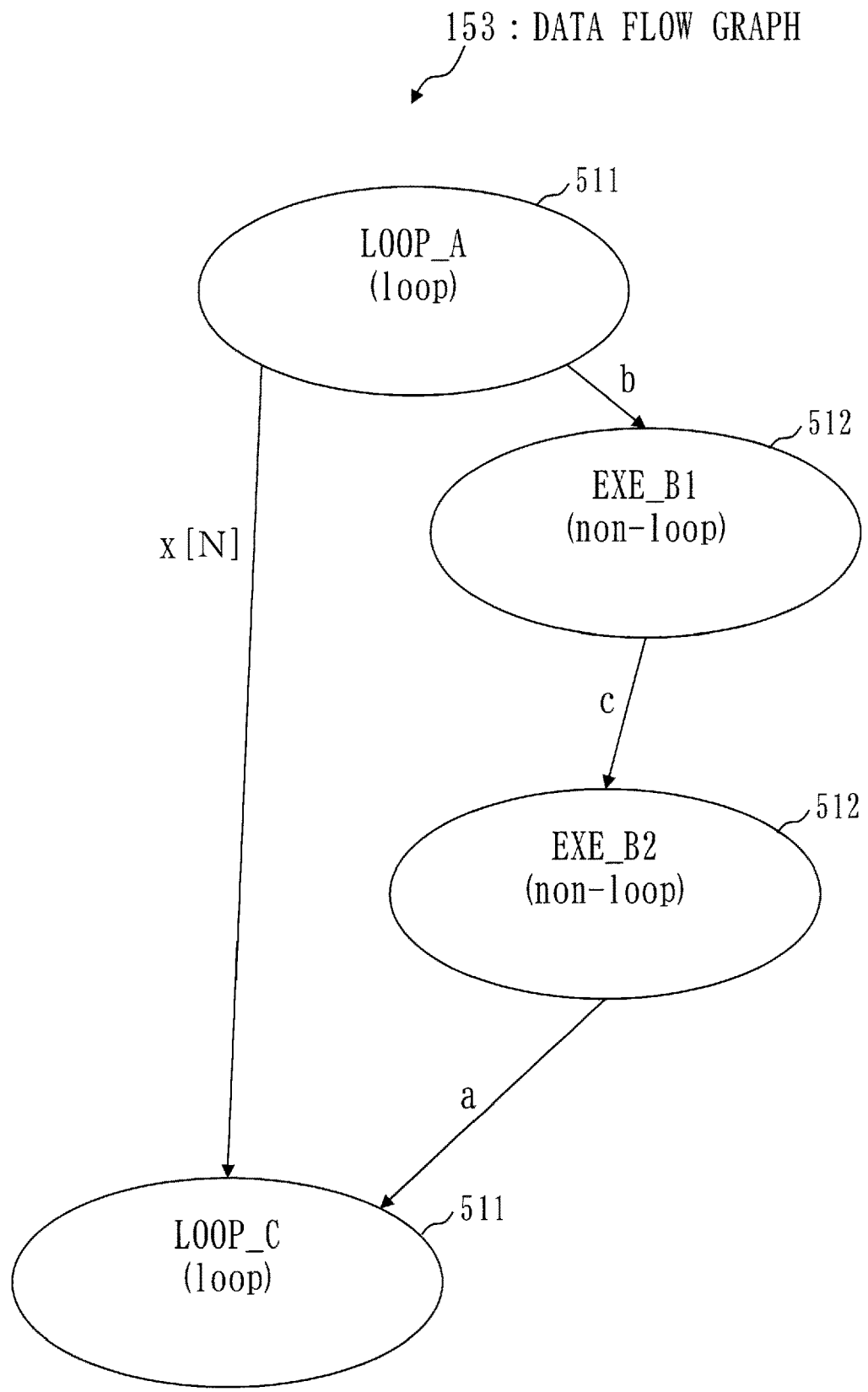
FIG. 4 illustrates an example of a data flow graph 153 according to Embodiment 1.

FIG. 4 illustrates an example of the data flow graph 153 according to this embodiment. The data flow graph 153 of FIG. 4 is generated based on the behavioral description 151 of FIG. 2. The extraction unit 110, by treating the run unit as the node, generates the data flow graph 153 which expresses inputs and outputs between the nodes. In FIG. 4, the extraction unit 110, by treating LOOP_A, EXE_B1, EXE_B2, and LOOP_C, each being a run unit, as node, generates the data flow graph 153 which expresses inputs and outputs between the nodes. The data flow graph 153 of FIG. 4 represents a relation among the nodes, for example, b is outputted from LOOP_A, being a loop description 511, to EXE_B1, being a logical description 512. The extraction unit 110 adds, as a node attribute, loop or non-loop to each node of the data flow graph 153. The extraction unit 110 adds, as the node attribute, loop if the node is a loop description 511, and non-loop if the node is a logical description 512 which is not a loop description 511.

In step S112 and step S113, the extraction unit 110 extracts a loop description 511 that can be merged with the logical description 512 without changing a function, as a loop description candidate 513, from the plurality of loop descriptions 511. In step S112 and step S113, the extraction unit 110 extracts logical descriptions 512 which exist before and after the loop descriptions 511, and loop description candidates 513 which are to be merged with those logical descriptions 512. In step S112, the extraction unit 110 executes upper-order search process S20 of searching for and extracting a loop existing above a non-loop being a logical description 512. In step S113, the extraction unit 110 executes lower-order search process S30 of searching for and extracting a loop existing below a non-loop being a logical description 512.

<Upper-Order Search Process S20>

Figure 5:
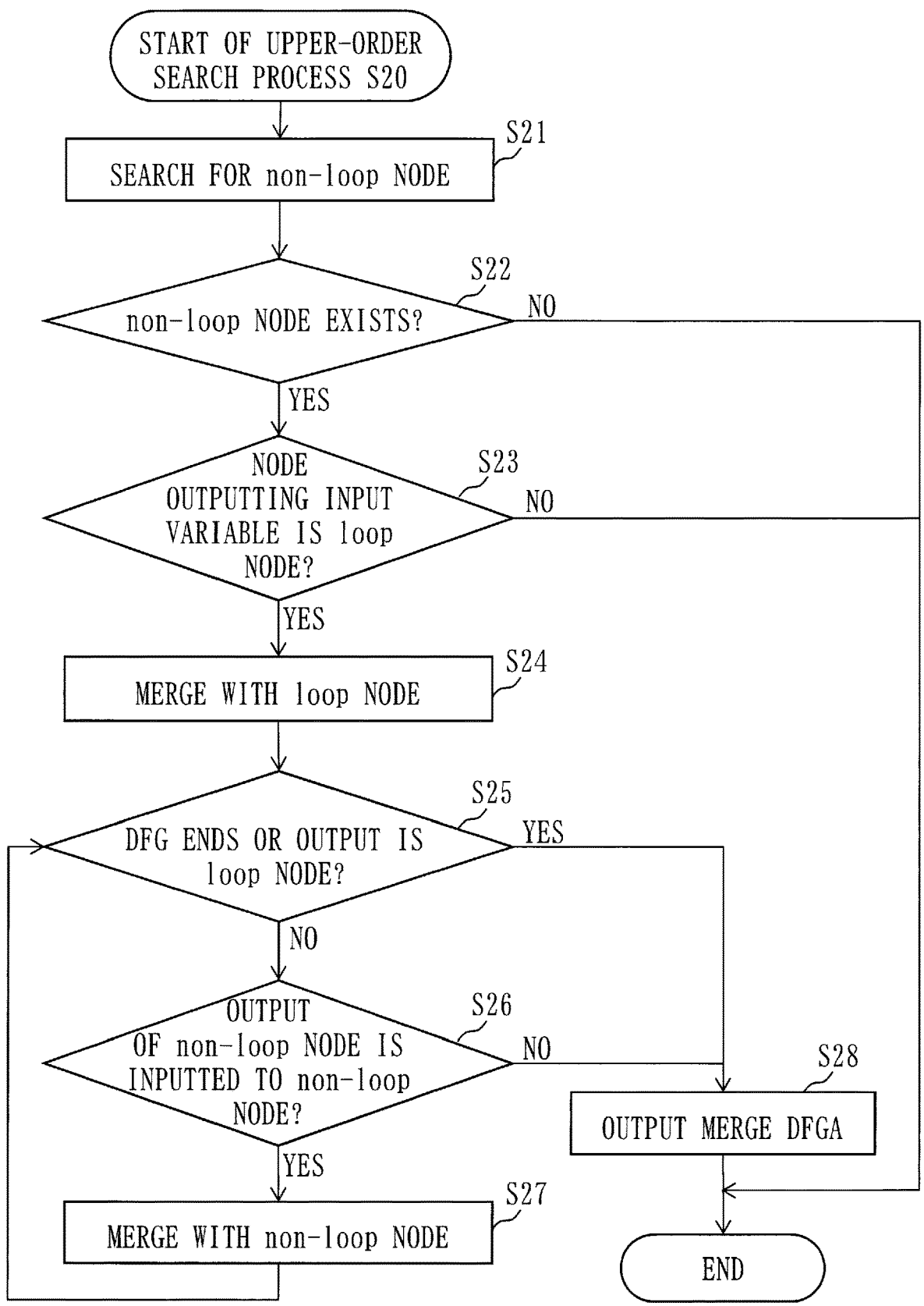
FIG. 5 is a flowchart illustrating upper-order search process S20 according to Embodiment 1.

Upper-order search process S20 according to this embodiment will be described with reference to FIG. 5.

In upper-order search process S20, the extraction unit 110, by using the data flow graph 153, extracts a former loop description 531 being a loop description 511 which is the nearest to the logical description 512, as the loop description candidate 513, from among the loop descriptions 511 executed before a logical description 512. More specifically, the extraction unit 110 performs upper-order search process S20 as follows.

In step S21, the extraction unit 110 searches for a non-loop node in the data flow graph 153.

In step S22, if a non-loop node exists, the extraction unit 110 advances to step S23. If a non-loop node does not exist, the extraction unit 110 ends the processing.

In step S23, the extraction unit 110 determines whether or not a node that outputs an input variable to that non-loop node is a loop node. If the node that outputs an input variable to the non-loop node is a loop node, the extraction unit 110 treats this loop node as a loop description candidate 513 and advances to step S24. If the node that outputs the input variable to the non-loop node is not a loop node, the extraction unit 110 ends the processing.

In step S24, the extraction unit 110 merges the loop node being the loop description candidate 513, with the processing-target non-loop node. In this merge, the extraction unit 110 treats, as a former loop description 531, the loop node which is determined as the loop description candidate 513. The extraction unit 110 treats, as a merge data flow graph A 153a, a data flow graph in which the loop node, being the loop description candidate 513, is merged with the processing-target non-loop node.

In step S25, the extraction unit 110 deteimines whether either the data flow graph 153 has ended or an output of the non-loop node is a loop node. If either the data flow graph 153 has ended or the output of the non-loop node is a loop node, the extraction unit 110 outputs the merge data flow graph A 153a (step S28) and ends the processing. If the data flow graph 153 has not ended and the output of the non-loop node is not a loop node, the extraction unit 110 advances to step S26.

In step S26, the extraction unit 110 determines whether the output of the non-loop node is inputted to a non-loop node. If the output of the non-loop node is not inputted to a non-loop node, the extraction unit 110 outputs the merge data flow graph A 153a (step S28) and ends the processing. If the output of the non-loop node is inputted to a non-loop node, the extraction unit 110 advances to step S27.

In step S27, the extraction unit 110 merges a non-loop node that receives an output of the processing-target non-loop node as input, with the processing-target non-loop node. That is, if the behavioral description 151 includes a plurality of logical descriptions, the extraction unit 110 combines adjacent logical descriptions among the plurality of logical descriptions, and treats the combination result as one logical description. Consequently, the processing-target non-loop node and the non-loop node that receives the output of the processing-target non-loop node as input, are merged with the node of the loop description candidate 513.

The extraction unit 110 repeats the processes of step S25 to step S27 until either the output from the processing-target non-loop node is a loop node, or the data flow graph 153 ends. In this manner, the loop description 511 which is the nearest to the processing-target non-loop node is extracted as the former loop description 531, from among the loop descriptions 511 executed before the processing-target non-loop node being the logical description 512. The extraction unit 110 outputs the merge data flow graph A 153a in which the former loop description 531, the processing-target non-loop node, and the non-loop node to receive the output of the processing-target non-loop node as input are merged.

As a specific example, upper-order search process S20 indicates the behavior of the extraction unit 110 of when inputting the sample code of the behavioral description 151 of FIG. 2.

First, the data flow graph 153 of FIG. 4 is generated from the sample code of the behavioral description 151 of FIG. 2. Then, the extraction unit 110 detects EXE_B1 as the processing-target non-loop node. The extraction unit 110 determines that the node that outputs an input variable b of the EXE_B1 node is LOOP_A of the loop attribute, and treats LOOP_A as the loop description candidate 513. The extraction unit 110 then merges EXE_B1 and LOOP_A. Furthermore, the extraction unit 110 determines that an output variable c of EXE_B1 is to be inputted to EXE_B2 of the non-loop attribute, and merges EXE_B1 and EXE_B2. Since an output variable a of EXE_B2 is inputted to LOOP_C of the loop attribute, the processing ends.

In the case where the extraction unit 110 performs search starting with EXE_B2 after detecting EXE_B2 as the processing target, the node that outputs an input variable c of the ECE_B2 node is the EXE_B1 node and is not a loop node, so the extraction unit 10 ends the processing, and the LOOP_A node is not extracted as the loop description candidate 513.

In this manner, the LOOP_A node being the loop description 511 which is the nearest to the EXE_B1 node, is extracted as the former loop description 531, from among the loop descriptions 511 executed before the EXE_B1 node which is the logical description 512.

Figure 6:
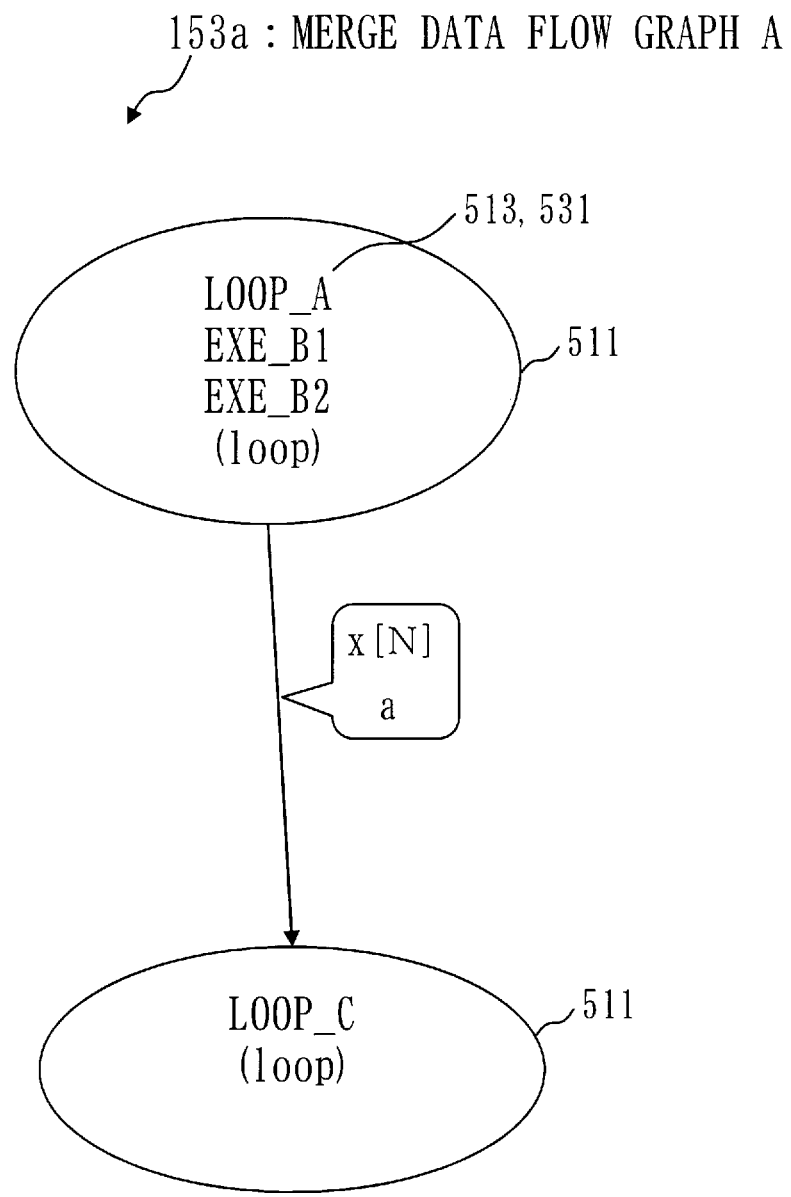
FIG. 6 illustrates an example of a merge data flow graph A 153a outputted by upper-order search process S20 according to Embodiment 1.

FIG. 6 illustrates an example of the merge data flow graph A 153a outputted by upper-order search process S20 according to this embodiment.

As illustrated in FIG. 6, EXE_B1 and EXE_B2 are merged with the LOOP_A node to form one loop description 511. The extraction unit 110 extracts the LOOP_A node being a loop description which the nearest to EXE_B1 and EXE_B2, as the former loop description 531, from among the loop descriptions 511 executed before EXE_B1 and EXE_B2.

<Lower-Order Search Process S30>

Figure 7:
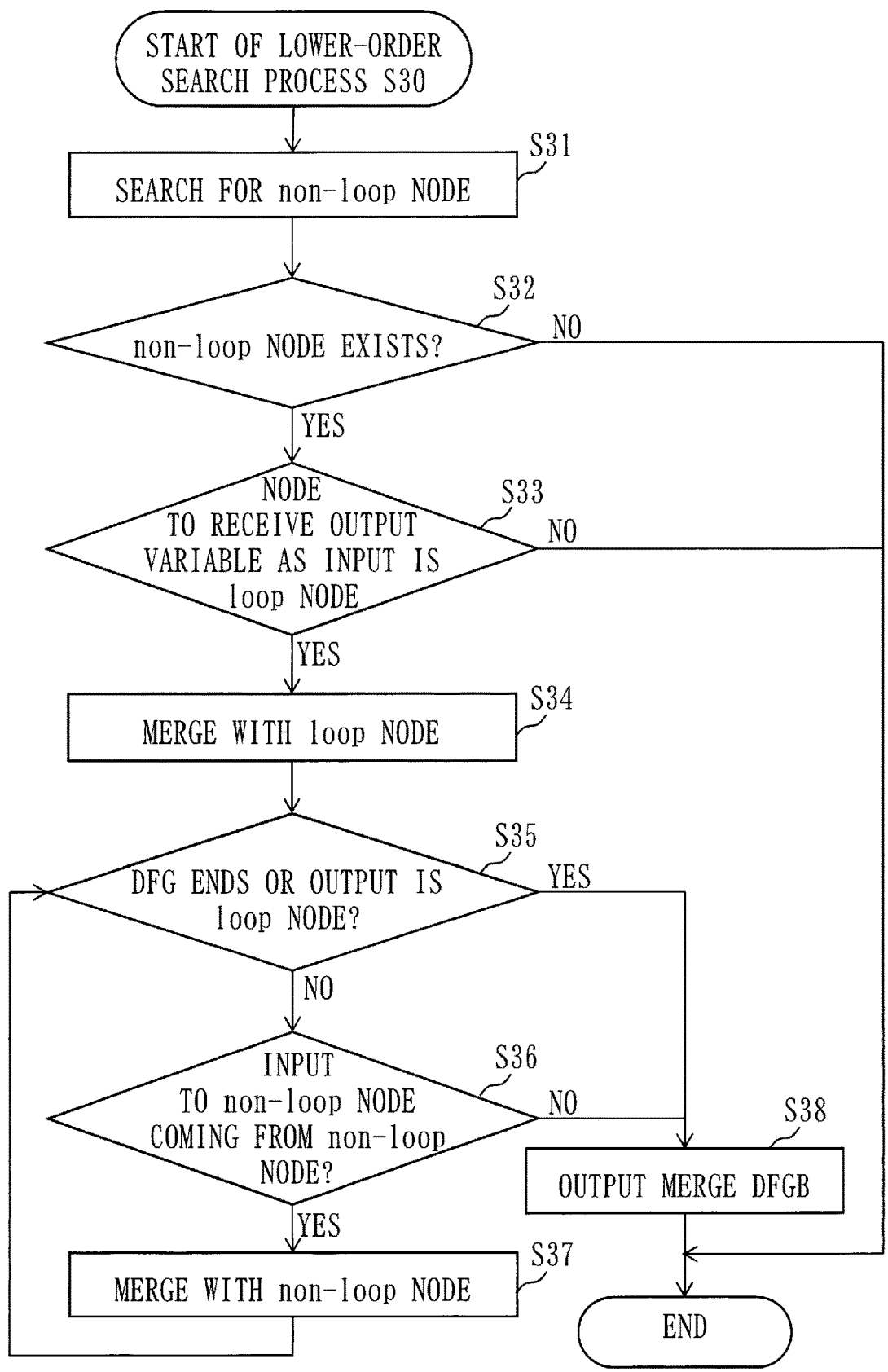
FIG. 7 is a flowchart illustrating lower-order search process S30 according to Embodiment 1.

Lower-order search process S30 according to this embodiment will be described with reference to FIG. 7.

In lower-order search process S30, the extraction unit 110, by using the data flow graph 153, extracts a latter loop description 532 being a loop description 511 which is the nearest to the logical description 512, as the loop description candidate 513, from among the loop descriptions 511 executed after the logical description 512. More specifically, the extraction unit 110 performs lower-order search process S30 as follows.

In step S31, the extraction unit 110 searches for a non-loop node in the data flow graph 153.

In step S32, if a non-loop node exists, the extraction unit 110 advances to step S33. If a non-loop node does not exist, the extraction unit 110 ends the processing.

In step S33, the extraction unit 110 determines whether a node to receive an output variable of that non-loop node as input is a loop node. If the node to receive the output variable of the non-loop node as input is a loop node, the extraction unit 110 treats this loop node as a loop description candidate 513 and advances to step S24. If the node to receive the output variable of the non-loop node as input is not a loop node, the extraction unit 110 ends the processing.

In step S34, the extraction unit 110 merges the loop node being the loop description candidate 513, with the processing-target non-loop node. In this merge, the extraction unit 110 treats the loop node determined as the loop description candidate 513, as a latter loop description 532. The extraction unit 110 treats a data flow graph in which the loop node, being the loop description candidate 513, is merged with the processing-target non-loop node, as a merge data flow graph B 153b.

In step S35, the extraction unit 110 determines whether either the data flow graph 153 has ended or an input to the non-loop node comes from a loop node. If either the data flow graph 153 has ended or the input to the non-loop node comes from a loop node, the extraction unit 110 outputs the merge data flow graph B 153b (step S38), and ends the processing. If the data flow graph 153 has not ended and the input to the non-loop node does not come from a loop node, the extraction unit 110 advances to step S36.

In step S36, the extraction unit 110 determines whether the input to the non-loop node comes from a non-loop node. If the input to the non-loop node does not come from a non-loop node, the extraction unit 110 outputs the merge data flow graph B 153b (step S38) and ends the processing. If the input to the non-loop node comes from a non-loop node, the extraction unit 110 advances to step S37.

In step S37, the extraction unit 110 merges a non-loop node that outputs an input to the processing-target non-loop node, with the processing-target non-loop node. That is, if the behavioral description 151 includes a plurality of logical descriptions, the extraction unit 110 treats adjacent logical descriptions among the plurality of logical descriptions, as one logical description.

Consequently, the processing-target non-loop node and the non-loop node that outputs the input to the processing-target non-loop node are merged with the node of the loop description candidate 513.

The extraction unit 110 repeats the processes of step S35 to step S37 until either the input to the processing-target non-loop node comes from a loop node or the data flow graph 153 ends. In this manner, the loop description 511 which is the nearest to the processing-target non-loop node is extracted as the latter loop description 532, from among the loop descriptions 511 executed after the processing-target non-loop node being the logical description 512. The extraction unit 110 outputs the merge data flow graph B 153b in which the latter loop description 532, the processing-target non-loop node, and the non-loop node that outputs the input variable to the processing-target non-loop node are merged.

As a specific example, lower-order search process S30 indicates the behavior of the extraction unit 110 of when inputting the sample code of the behavioral description 151 of FIG. 2.

First, the data flow graph 153 of FIG. 4 is generated from the sample code of the behavioral description 151 of FIG. 2. Then, the extraction unit 110 detects EXE_B2 as the processing-target non-loop node. The extraction unit 110 determines that the node to receive the output variable a of the EXE_B2 node as input is LOOP_C of the loop attribute, and treats LOOP_C as the loop description candidate 513. The extraction unit 110 then merges EXE_B2 and LOOP_C. Furthermore, the extraction unit 110 determines that the input variable c to EXE_B2 is an output from EXE_B1 of the non-loop attribute, and merges EXE_B1 and EXE_B2. Since the input variable b to EXE_B1 is an output from LOOP_A of the loop attribute, the processing ends.

In the case where the extraction unit 110 performs search starting with EXE_B1 after detecting EXE_B1 as the processing target, the node to receive the output variable c of the ECE_B1 node as input is the EXE_B2 node and is not a loop node, so the extraction unit 10 ends the processing, and the LOOP_C node is not extracted as the loop description candidate 513.

In this manner, the LOOP_C node being the loop description 511 which is the nearest to the EXE_B2 node is extracted as the latter loop description 532, from among the loop descriptions 511 executed after the EXE_B2 node which is the logical description 512.

Figure 8:
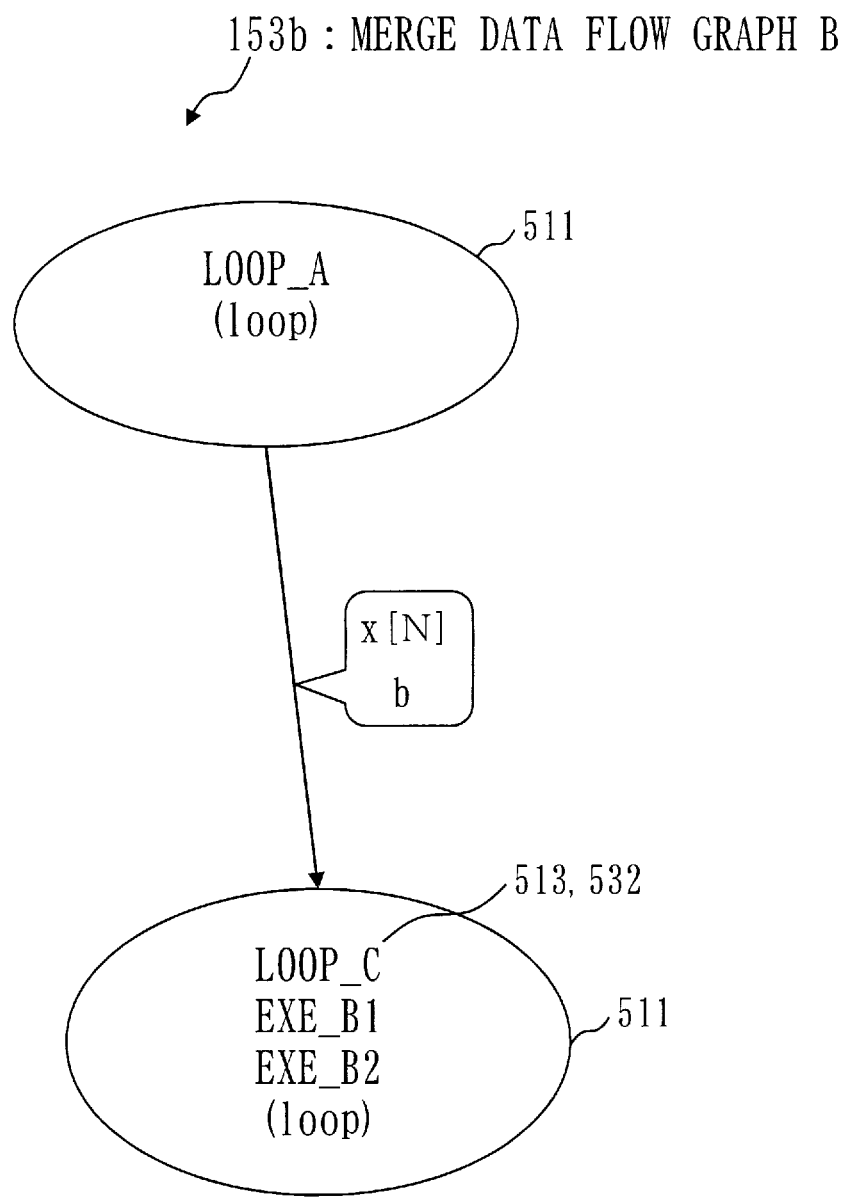
FIG. 8 illustrates an example of a merge data flow graph B 153b outputted by lower-order search process S30 according to Embodiment 1.

FIG. 8 illustrates an example of the merge data flow graph B 153b outputted by upper-order search process S20 according to this embodiment.

As illustrated in FIG. 8, EXE_B1 and EXE_B2 are merged with the LOOP_C node to form one loop description 511. The extraction unit 110 extracts the LOOP_C node being a loop description which is the nearest to EXE_B1 and EXE_B2, as the latter loop description 532, from among the loop descriptions 511 executed after EXE_B1 and EXE_B2.

If the behavioral description 151 of FIG. 2 is changed to a sample code that does not include LOOP_A, a data flow graph not including a LOOP_A node in FIG. 8 is generated in lower-order search process S30. If the behavioral description 151 of FIG. 2 is changed to a sample code not including LOOP_A, nothing hits as the loop description candidate 513 in upper-order search process S20.

Conversely, if the behavioral description 151 of FIG. 2 is changed to a sample code not including LOOP_C, a data flow graph not including a LOOP_C node in FIG. 6 is generated in upper-order search process S20. Also, if the behavioral description 151 of FIG. 2 is changed to a sample code not including LOOP_C, nothing hits as the loop description candidate 513 in lower-order search process S30.

As described above, by upper-order search process S20 and lower-order search process S30, the extraction unit 110 generates a data flow graph of the case where the logical description 512 is merged with each of the loop description candidates 513, as the merge data flow graph.

<Search Result Integration Process S40>

In step S114, the extraction unit 110 executes search result integration process S40. The extraction unit 110 executes upper-order search process S20 and lower-order search process S30. Only when the same results are obtained, the extraction unit 110 deletes the search results, and integrates the upper-order search result and the lower-order search result. More specifically, the extraction unit 110 compares the merge data flow graph A 153*a* obtained by upper-order search process S20, with the merge data flow graph B 153*b* obtained by lower-order search process S30. If the merge data flow graph A 153*a* and the merge data flow graph B 153*b* are the same, the extraction unit 110 deletes the search results, and integrates the upper-order search result and the lower-order search result.

<Circuit Characteristics Calculation Process S50>

In step S115, the extraction unit 110 executes circuit characteristics calculation process S50. The extraction unit 110 calculates, as circuit characteristics 514, the characteristics of the circuit of the case where the logical description 512 is merged with the loop description candidate 513. The extraction unit 110 calculates at least either the latency of the circuit or the memory capacity needed by the circuit, as the circuit characteristics 514. When calculating the memory capacity needed by the circuit as the circuit characteristics 514, the extraction unit 110 calculates a total number of bits of input/output variables between nodes in the merge data flow graph, as the circuit characteristics 514. The extraction unit 110 stores the calculated total number of bits to the storage unit 150, as the circuit characteristics information 154. More specifically, the extraction unit 110 calculates the total number of bits of the input/output variables of the nodes, for each of the merge data flow graph A 153*a* and merge data flow graph B 153*b*.

Figures 9, 10:
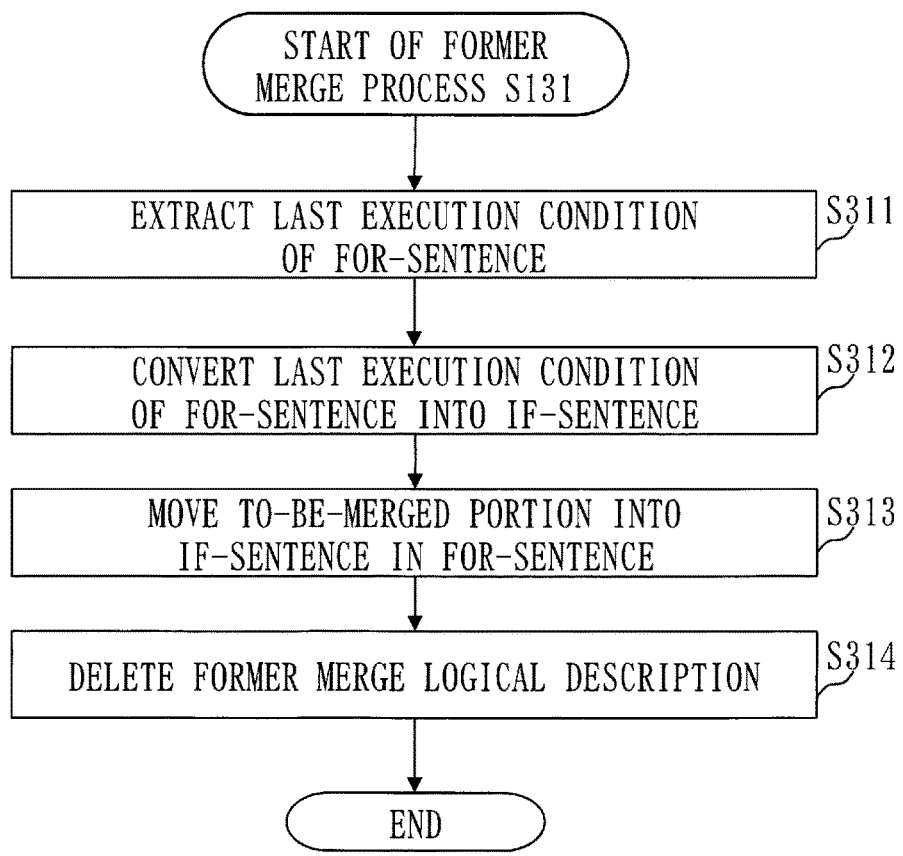
FIG. 9 illustrates an example of circuit characteristics information 154 according to Embodiment 1.
FIG. 10 is a flowchart illustrating former merge process S131 according to Embodiment 1.

FIG. 9 is a diagram illustrating an example of the circuit characteristics information 154 according to this embodiment.

The circuit characteristics information 154 has, as items, a data flow graph serving as a candidate, a FROM node being a node of a variable output source, a TO node being a node of a variable output destination, and a number of bits.

The first row of the circuit characteristics information 154 expresses information concerning the data flow graph A illustrated in FIG. 6. The FROM node is a loop description 511 in which LOOP_A, EXE_B1, and EXE_B2 are merged. The TO node is LOOP_C. Here, N (100) of x have 32 bits each and a has 16 bits (definition of short), so that the total is 3216 bits.

The second row of the circuit characteristics information 154 expresses information concerning the data flow graph B illustrated in FIG. 8. The FROM node is LOOP_A. The TO node is a loop description 511 in which EXE_B1, EXE_B2, and LOOP_C are merged. Here, N (100) of x have 32 bits each (definition of int) and b has 32 bits, so that the total is 3232 bits.

<Determination Process S120>

In determination process S120, the determination unit 120 determines a loop description 511 to be merged with the logical description 512, from the loop description candidates 513 based on the circuit characteristics 514. Here, the loop description 511 determined by the determination unit 120 is treated as a determined loop description 515.

More specifically, the determination unit 120 acquires the circuit characteristics information 154 from the storage unit 150. The determination unit 120 refers to the circuit characteristics information 154 and selects a merge data flow graph in which the circuit characteristics 514 expresses the most efficient value. For example, if the circuit characteristics 514 represent the circuit latency, a merge data flow graph in which the latency is the smallest is selected. If the circuit characteristics 514 represent the circuit memory capacity, a merge data flow graph in which the total bits of the input/output variables are the fewest is selected. The determination unit 120 treats a loop description 511 which is merged with a logical description 512 in the selected merge data flow graph, as the determined loop description 515. In this manner, the determination unit 120 determines a loop description merged with a logical description in a merge data flow graph in which the total number of bits of the input/output variables is the smallest, as a loop description to be merged with the logical description.

In a specific example, when the determination unit 120 acquires the circuit characteristics information 154 of FIG. 9, the merge data flow graph A 153*a* in which the total number of bits is the smallest, is selected. Then, the determination unit 120 treats LOOP_A which is merged with EXE_B1 and EXE_B2, both being logical descriptions 512 in the merge data flow graph A 153*a*, as the determined loop description 515.

<Merge Process S130>

In merge process S130, the merge unit 130 merges the logical description 512 with the loop description determined in determination process S120, that is, the determined loop description 515. The behavioral description 151 in which the logical description 512 is merged with the determined loop description 515 is treated as the converted behavioral description 157. As mentioned earlier, the loop description candidates 513 to be merged with the logical descriptions 512 include the former loop description 531 and the latter loop description 532. Former merge process S131 is a process of merging the logical description 512 with the former loop description 531 by the merge unit 130. Latter merge process S132 is a process of merging the logical description 512 with the latter loop description 532 by the merge unit 130.

<Former Merge Process S131>

Former merge process S131 according to this embodiment will be described with reference to FIG. 10.

In former merge process S131, the merge unit 130, when merging the logical description 512 with the former loop description 531, merges the logical description 512 with the former loop description 531 such that a process by the logical description 512 is executed in the last repetitive process of the former loop description 531. More specifically, the merge unit 130 converts the behavioral description 151 such that the process by the logical description 512 to be merged is executed in the last execution of a for-sentence of the former loop description 531, and outputs a converted behavioral description 157*a*.

In step S311, the merge unit 130 extracts the last execution condition of the for-sentence in the determined loop description 515 of the behavioral description 151. In step S312, the merge unit 130 converts the last execution condition of the for-sentence into an if-sentence.

In step S313, the merge unit 130 moves a logical description portion to be merged, into the if-sentence in the for-sentence.

In step S314, the merge unit 130 deletes the logical description portion of before merge. The merge unit 130 stores the converted behavioral description 157 which is converted from the behavioral description 151, to the storage unit 150.

FIG. 11 illustrates an example of the converted behavioral description 157*a* of when former merge process S131 according to this embodiment is practiced. The portion indicated by a broken line in FIG. 11 is the portion merged with the logical description 512. The converted behavioral description 157*a* has been converted such that EXE_B1 and EXE_B2 are executed in the last execution of the for-sentence in LOOP_A.

<Latter Merge Process S132>

Figure 12:
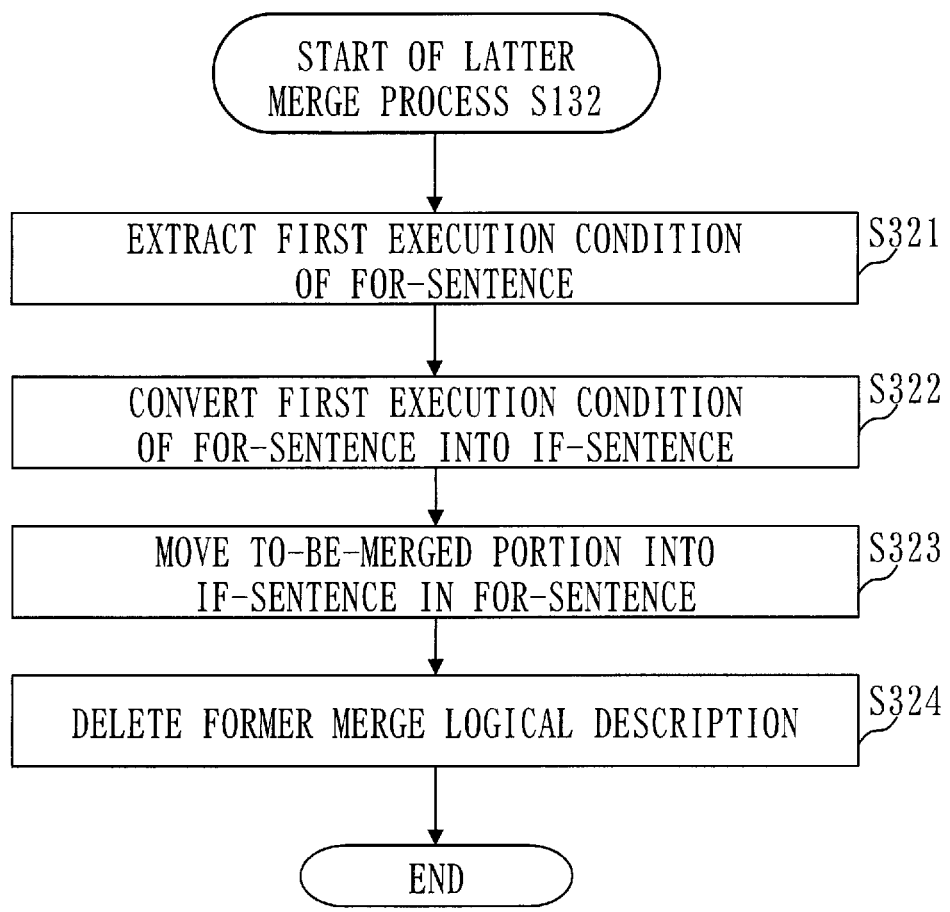
FIG. 12 is a flowchart illustrating latter merge process S132 according to Embodiment 1.

Latter merge process S132 according to this embodiment will be described with reference to FIG. 12.

In latter merge process S132, the merge unit 130, when merging the logical description 512 with the latter loop description 532, merges the logical description 512 with the latter loop description 532 such that a process by the logical description 512 is executed in the first repetitive process of the latter loop description 532. More specifically, the merge unit 130 converts the behavioral description 151 such that the process by the logical description 512 to be merged is executed in the first execution of the for-sentence of the latter loop description 532, and outputs a converted behavioral description 157b.

In step S321, the merge unit 130 extracts the first execution condition of the for-sentence in the determined loop description 515 of the behavioral description 151.

In step S322, the merge unit 130 converts the first execution condition of the for-sentence into an if-sentence.

In step S323, the merge unit 130 moves the logical description portion to be merged, into the if-sentence in the for-sentence.

In step S324, the merge unit 130 deletes the logical description portion of before merge. The merge unit 130 stores the converted behavioral description 157 which is converted from the behavioral description 151, to the storage unit 150.

FIG. 13 illustrates an example of the converted behavioral description 157b of when latter merge process S132 according to this embodiment is practiced. The portion indicated by a broken line in FIG. 13 is the portion merged with the logical description 512. The converted behavioral description 157b has been converted such that EXE_B1 and EXE_B2 are executed in the first execution of the for-sentence in LOOP_C.

In the conversion process of the behavioral description 151 such as former merge process S131 and latter merge process S132, the merge unit 130 converts the data flow graph into an abstract tree structure once, and converts the abstract tree structure as the source code.

<High-Level Synthesis Execution Process S140>

In high-level synthesis execution process S140, the high-level synthesis unit 140 acquires the converted behavioral description 157 and the non-functional requirement 152 from the storage unit 150 and executes high-level synthesis. The high-level synthesis unit 140 outputs the RTL 155 and synthesis report 156, as the result of high-level synthesis.

*Other Configurations*

In this embodiment, ordinary high-level synthesis process is practiced on a converted behavioral description. Alternatively, this converted behavioral description may be inputted to an existing tool that can practice high-level synthesis more efficiently.

In this embodiment, the processing in the source code has been described as a specific example of the behavioral description 151. Alternatively, this embodiment may be applied to a control data flow graph generated from the source code, or to a behavioral description 151 such as abstract tree syntax.

In this embodiment, the determination unit selects an optimum merge data flow graph from the circuit characteristics information 154. Alternatively, the determination unit may practice synthesis on each of all the candidates by a high-level synthesis unit, and then perform a process of excluding candidates in which the module has a large latency, from the merge target. When a module has a large latency, there is a possibility that the latency may be decreased by not performing merging. Therefore, by such a latency constraint, merging can be performed more appropriately.

The high-level synthesis device 100 according to this embodiment may have a communication device which communicates with other devices via a network. The communication device has a receiver and a transmitter. The communication device is connected to a communication network such as a LAN, the Internet, and a telephone line in a wired manner or a non-wired manner. The communication is more specifically a communication chip or network interface card (NIC). The communication device is a communication unit to communicate data. The receiver is a receiving unit to receive data. The transmitter is a transmission unit to transmit data. The high-level synthesis device 100 according to this embodiment may acquire the behavioral description and the non-functional requirement via the communication device. The high-level synthesis device 100 according to this embodiment may transmit the converted behavioral description to other devices via the communication device.

In this embodiment, the functions of the extraction unit 110, determination unit 120, merge unit 130, and high-level synthesis unit 140 are implemented by software. Alternatively, in a modification, the functions of an extraction unit 110, determination unit 120, merge unit 130, and high-level synthesis unit 140 may be implemented by hardware.

A configuration of a high-level synthesis device 100 according to a modification of this embodiment will be described with reference to FIG. 14.

Figure 14:
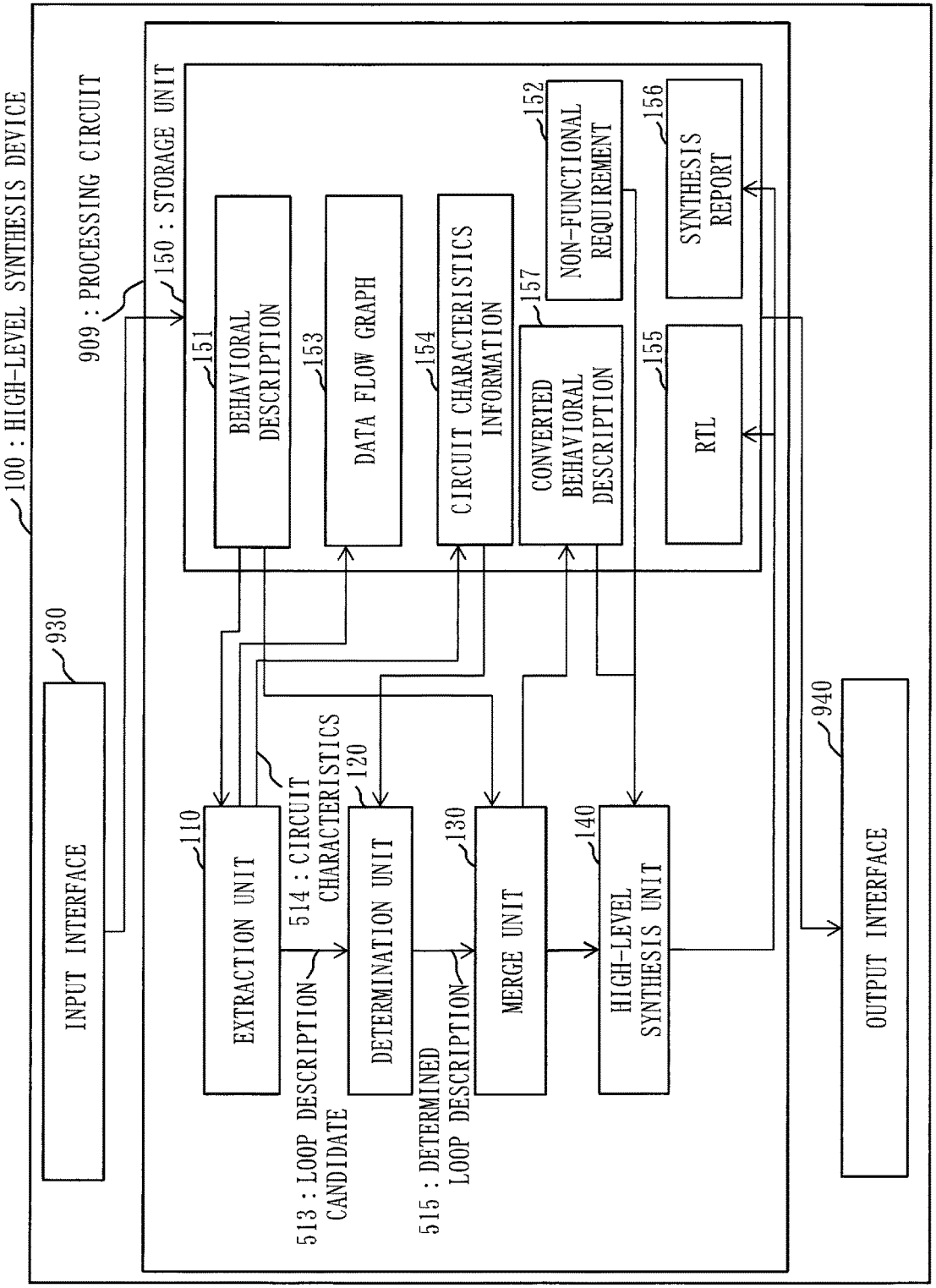
FIG. 14 is a configuration diagram of a high-level synthesis device 100 according to a modification of Embodiment 1.

As illustrated in FIG. 14, the high-level synthesis device 100 is provided with hardware devices such as a processing circuit 909, an input interface 930, and an output interface 940.

The processing circuit 909 is an exclusive electronic circuit that implements the functions of an extraction unit 110, determination unit 120, merge unit 130, and high-level synthesis unit 140 described above, and a storage unit 150 described above. The processing circuit 909 is more specifically a single circuit, a composite circuit, a programmed processor, a parallel-programmed processor, a logic IC, a GA, an ASIC, or an FPGA. GA is an abbreviation for gate array, ASIC is an abbreviation for application specific integrated circuit, and FPGA is an abbreviation for field-programmable gate array.

The functions of the extraction unit 110, determination unit 120, merge unit 130, and high-level synthesis unit 140 may be implemented by one processing circuit 909, or may be implemented by sharing among a plurality of processing circuits 909.

In another modification, the functions of an extraction unit 110, determination unit 120, merge unit 130, and high-level synthesis unit 140 may be implemented by a combination of software and hardware. That is, some of the functions of a high-level synthesis device 100 may be implemented by exclusive hardware, and the remaining functions may be implemented by software.

The processor 910, storage device 920, and processing circuit 909 of the high-level synthesis device 100 are collectively referred to as "processing circuitry". That is, whether the configuration of the high-level synthesis device 100 may be the configuration illustrated in FIG. 1 or the configuration illustrated in FIG. 14, the functions of the extraction unit 110, determination unit 120, merge unit 130, and high-level synthesis unit 140 and the storage unit 150 are implemented by the processing circuitry.

"Unit" may be replaced by "step", "stage", or "process". The function of the "unit" may be implemented by firmware.

Description of Advantageous Effects of this Embodiment

The high-level synthesis device 100 according to this embodiment is provided with the extraction unit to extract a logical description which exists before or after a loop description in a behavioral description and which is not a loop description. The high-level synthesis device 100 according to this embodiment is provided with a merge unit to merge a logical description which is not a loop description, with one loop description without changing the function. Hence, with the high-level synthesis device 100 according to this embodiment, modules of the behavioral description can be divided automatically and appropriately, making it possible to design an optimum circuit within a short period of time.

The high-level synthesis device 100 according to this embodiment, when merging a logical description not being a loop description with a loop description, selects a loop description to be merged, based on the latency restriction or memory capacity. Hence, with the high-level synthesis device 100 according to this embodiment, optimum module division can be realized automatically.

The high-level synthesis device 100 according to this embodiment generates a data flow graph from the behavioral description. When there are a plurality of combinations of a node, not being a loop description, and a loop description, the high-level synthesis device 100 extracts a combination of merges which, for example, minimizes the total number of bits of inputs/outputs on the data flow graph. Also, the high-level synthesis device 100 according to this embodiment generates a data flow graph from the behavioral description, and merges a group of nodes not being loop descriptions, as one node. Therefore, with the high-level synthesis device 100 according to this embodiment, optimum candidates that can, for example, minimize the total number of bits, can be extracted. Also, with the high-level synthesis device 100 according to this embodiment, by performing integration that minimizes the total number of bits, an effect of reducing the memory capacity between modules can be obtained.

In Embodiment 1, individual units in the high-level synthesis device 100 serve as independent functional blocks to constitute the high-level synthesis device 100. However, the configuration need not be as in the embodiment described above; the configuration of the high-level synthesis device 100 is arbitrary. The functional blocks of the high-level synthesis device 100 are arbitrary as far as they can implement the functions described in the above embodiment. The high-level synthesis device 100 may be constituted by any other combination of these functional blocks, or by an arbitrary block configuration.

The high-level synthesis device 100 need not be a single device but may be a system composed of a plurality of devices.

Having described Embodiment 1, a plurality of portions in this embodiment may be combined and practiced. Alternatively, one portion of this embodiment may be practiced. This embodiment may be practiced entirely, or partially by any combination of its portions.

The embodiment described above is an essentially preferable exemplification and is not intended to limit the scope of the present invention, the scope of application of the present invention, and the scope of use of the present invention. Various changes may be made where necessary.

REFERENCE SIGNS LIST

100: high-level synthesis device; 110: extraction unit; 120: determination unit; 130: merge unit; 140: high-level synthesis unit; 150: storage unit; 151: behavioral description; 152: non-functional requirement; 153: data flow graph; 153a: merge data flow graph A; 153b: merge data flow graph B; 154: circuit characteristics information; 155: RTL; 156: synthesis report; 157, 157a, 157b: converted behavioral description; 511: loop description; 512: logical description; 513: loop description candidate; 514: circuit characteristics; 515: determined loop description; 531: former loop description; 532: latter loop description; 610: high-level synthesis method; 620: high-level synthesis program; 909: processing circuit; 910: processor; 920: storage device; 921: memory; 922: auxiliary storage device; 930: input interface; 940: output interface; S100: high-level synthesis process; S110: extraction process; S120: determination process; S130: merge process; S140: high-level synthesis execution process; S10: data flow graph generation process; S20: upper-order search process; S30: lower-order search process; S40: search result integration process; S50: circuit characteristics calculation process; S131: former merge process; S132: latter merge process

The invention claimed is:

1. A high-level synthesis device for executing high-level synthesis on a behavioral description describing a behavior of a circuit that implements a function, the behavioral description including a plurality of loop descriptions describing a repetitive process and a logical description describing a process that is not a repetitive process, the high-level synthesis device comprising:
   processing circuitry configured to
      extract loop descriptions that can be merged with the logical description without changing the function, as loop description candidates, from among the plurality of loop descriptions, and calculate, as circuit characteristics, characteristics of the circuit of a case where the logical description is merged with each of the loop description candidates,
      determine a loop description to be merged with the logical description, from the loop description candidates based on the circuit characteristics, and
      merge the logical description with the determined loop description.

2. The high-level synthesis device according to claim 1, wherein the processing circuitry extracts, as the loop description candidates, a former loop description being a loop description which is the nearest to the logical description, from among loop descriptions executed before the logical description, and a latter loop description which is the nearest to the logical description, from among loop descriptions executed after the logical description.

3. The high-level synthesis device according to claim 2, wherein the processing circuitry generates a data flow graph having the plurality of loop descriptions included in the behavioral description and the logical description included in the behavioral description, as nodes, and extracts, using the data flow graph, the former loop description and the latter loop description, as the loop description candidates.

4. The high-level synthesis device according to claim 3, wherein the processing circuitry calculates at least either a latency of the circuit or a memory capacity needed by the circuit, as the circuit characteristics.

5. The high-level synthesis device according to claim 4, wherein the processing circuitry
   generates a data flow graph of a case where the logical description is merged with each of the loop description candidates, as a merge data flow graph, and calculates a total number of bits of input/output variables between nodes in the merge data flow graph, as the circuit characteristics, and determines a loop description merged with the logical description in a merge data flow graph in which a total number of bits of the input/output variables is the smallest, as a loop description to be merged with the logical description.

6. The high-level synthesis device according to claim 5, wherein the processing circuitry, when merging the logical description with the former loop description, merges the logical description with the former loop description such that a process by the logical description is executed in a last repetitive process of the former loop description, and when merging the logical description with the latter loop description, merges the logical description with the latter loop description such that a process by the logical description is executed in a first repetitive process of the latter loop description.

7. The high-level synthesis device according to claim 5, wherein the behavioral description includes a plurality of logical descriptions, and wherein the processing circuitry combines adjacent logical descriptions among the plurality of logical descriptions, and treats the combination result as the logical description.

8. The high-level synthesis device according to claim 4, wherein the processing circuitry, when merging the logical description with the former loop description, merges the logical description with the former loop description such that a process by the logical description is executed in a last repetitive process of the former loop description, and when merging the logical description with the latter loop description, merges the logical description with the latter loop description such that a process by the logical description is executed in a first repetitive process of the latter loop description.

9. The high-level synthesis device according to claim 4, wherein the behavioral description includes a plurality of logical descriptions, and wherein the processing circuitry combines adjacent logical descriptions among the plurality of logical descriptions, and treats the combination result as the logical description.

10. The high-level synthesis device according to claim 3, wherein the processing circuitry, when merging the logical description with the former loop description, merges the logical description with the former loop description such that a process by the logical description is executed in a last repetitive process of the former loop description, and when merging the logical description with the latter loop description, merges the logical description with the latter loop description such that a process by the logical description is executed in a first repetitive process of the latter loop description.

11. The high-level synthesis device according to claim 3, wherein the behavioral description includes a plurality of logical descriptions, and wherein the processing circuitry combines adjacent logical descriptions among the plurality of logical descriptions, and treats the combination result as the logical description.

12. The high-level synthesis device according to claim 2, wherein the processing circuitry, when merging the logical description with the former loop description, merges the logical description with the former loop description such that a process by the logical description is executed in a last repetitive process of the former loop description, and when merging the logical description with the latter loop description, merges the logical description with the latter loop description such that a process by the logical description is executed in a first repetitive process of the latter loop description.

13. The high-level synthesis device according to claim 2, wherein the behavioral description includes a plurality of logical descriptions, and wherein the processing circuitry combines adjacent logical descriptions among the plurality of logical descriptions, and treats the combination result as the logical description.

14. The high-level synthesis device according to claim 1, wherein the behavioral description includes a plurality of logical descriptions, and wherein the processing circuitry combines adjacent logical descriptions among the plurality of logical descriptions, and treats the combination result as the logical description.

15. A high-level synthesis method of a high-level synthesis device for executing high-level synthesis on a behavioral description describing a behavior of a circuit that implements a function, the behavioral description including a plurality of loop descriptions describing a repetitive process and a logical description describing a process that is not a repetitive process, the high-level synthesis method comprising:

extracting loop descriptions that can be merged with the logical description without changing the function, as loop description candidates, from among the plurality of loop descriptions;

calculating characteristics of the circuit of a case where the logical description is merged with each of the loop description candidates, as circuit characteristics;

determining a loop description to be merged with the logical description, from the loop description candidates based on the circuit characteristics; and merging the logical description with the determined loop description.

16. A non-transitory computer readable medium storing a high-level synthesis program of a high-level synthesis device for executing high-level synthesis on a behavioral description describing a behavior of a circuit that implements a function, the behavioral description including a plurality of loop descriptions describing a repetitive process and a logical description describing a process which is not a repetitive process, the high-level synthesis program causing the high-level synthesis device which is a computer, to execute:

an extraction process of extracting loop descriptions that can be merged with the logical description without changing the function, as loop description candidates, from among the plurality of loop descriptions;

a circuit characteristics calculation process of calculating characteristics of the circuit of a case where the logical description is merged with each of the loop description candidates, as circuit characteristics;

a determination process of determining a loop description to be merged with the logical description, from the loop description candidates based on the circuit characteristics; and a merging process of merging the logical description with the loop description determined by the determination process.

* * * * *